United States Patent
Voss et al.

(10) Patent No.: US 9,548,370 B2
(45) Date of Patent: Jan. 17, 2017

(54) TRANSISTOR DEVICE WITH INTEGRATED GATE-RESISTOR

(71) Applicant: Infineon Technologies AG, Neubiberg (DE)

(72) Inventors: Stephan Voss, Munich (DE); Peter Tuerkes, Unterhaching (DE); Holger Huesken, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/692,235

(22) Filed: Apr. 21, 2015

(65) Prior Publication Data
US 2015/0228744 A1 Aug. 13, 2015

Related U.S. Application Data

(63) Continuation of application No. 13/950,813, filed on Jul. 25, 2013, now Pat. No. 9,041,120.

(51) Int. Cl.
*H01L 29/43* (2006.01)
*H01L 27/07* (2006.01)
*H01L 27/06* (2006.01)

(52) U.S. Cl.
CPC ......... *H01L 29/435* (2013.01); *H01L 27/0629* (2013.01); *H01L 27/075* (2013.01); *H01L 27/0727* (2013.01)

(58) Field of Classification Search
CPC ............... H01L 29/435; H01L 27/0629; H01L 27/0727; H01L 27/075
See application file for complete search history.

(56) References Cited

U.S. PATENT DOCUMENTS

| | | |
|---|---|---|
| 5,592,006 A | 1/1997 | Merrill |
| 5,793,065 A | 8/1998 | Shinohe et al. |
| 2003/0173619 A1 | 9/2003 | Feldtkeller et al. |
| 2011/0133246 A1 | 6/2011 | Ueno |
| 2012/0049290 A1 | 3/2012 | Shiraishi et al. |

(Continued)

FOREIGN PATENT DOCUMENTS

| | | |
|---|---|---|
| CN | 101814911 A | 8/2010 |
| CN | 103001620 A | 3/2013 |

(Continued)

*Primary Examiner* — Mohsen Ahmadi
(74) *Attorney, Agent, or Firm* — Murphy, Bilak & Homiller, PLLC

(57) ABSTRACT

A transistor device includes an individual transistor cell arranged in a transistor cell field on a semiconductor body, the individual transistor cell having a gate electrode. The transistor device further includes a gate contact, electrically coupled to the gate electrode and configured to switch on the individual transistor cell by providing a gate current in a first direction and configured to switch off the individual transistor cell by providing a gate current in a second direction, the second direction being opposite to the first direction. The transistor device also includes a gate-resistor structure monolithically integrated in the transistor device. The gate-resistor structure provides a first resistance for the gate current when the gate current flows in the first direction, and provides a second resistance for the gate current, which is different from the first resistance, when the gate current flows in the second direction.

7 Claims, 13 Drawing Sheets

(56) References Cited

U.S. PATENT DOCUMENTS

| | | | |
|---|---|---|---|
| 2012/0056258 A1* | 3/2012 | Chen | ................ H01L 21/76254 |
| | | | 257/316 |
| 2012/0080718 A1 | 4/2012 | Soeno | |
| 2014/0117405 A1 | 5/2014 | Park et al. | |

FOREIGN PATENT DOCUMENTS

| | | |
|---|---|---|
| CN | 103165597 A | 6/2013 |
| WO | 0033380 A1 | 6/2000 |

* cited by examiner (a)

(b)

(a)

(b)

TRANSISTOR DEVICE WITH INTEGRATED GATE-RESISTOR

TECHNICAL FIELD

Embodiments of the present description relate to the field of power MOS transistors such as Metal Oxide Semiconductor Field Effect Transistors (MOSFETs) or Insulated Gate Bipolar Transistors (IGBTs).

BACKGROUND

MOS transistors (such as power MOSFETs or IGBTs) can be switched on and off by charging and discharging the gate of the transistor. In order to control the transition between a non-conductive (off-state) and a conductive state (on-state), and vice versa, a gate-resistor is usually connected to a gate electrode of the transistor. The resistance of the gate-resistor limits the gate current that charges or discharges the gate. For charging and discharging the gate capacitor of power MOS transistors, dedicated gate driver circuits (or simply gate drivers) are used. Such gate drivers charge and discharge the gate in response to one or more logic signals (binary signals) which may represent the desired switching state (on or off) of the transistor.

In some applications it is desired to have different gate current values for charging and, respectively, discharging the gate of a MOS transistor. Different gate current values for charging and discharging the gate result in an asymmetric switching, i.e., the switching times are significantly different for switching transistor on and off. Such an asymmetric switching behavior may be achieved, for example, by using appropriately designed gate driver circuits. Such gate drivers usually require a relatively complicated circuit design. Furthermore, various undesired effects may occur due to unavoidable parasitic circuit components present within such gate driver circuits. Thus there is a need for an improved MOS transistor which allows asymmetric switching without the need for sophisticated gate driver circuits.

SUMMARY

An aspect of the present invention relates to a transistor device. The transistor device comprises: at least one individual transistor cell arranged in a transistor cell field on a semiconductor body, each individual transistor cell comprising a gate electrode; a gate contact, electrically coupled to the gate electrodes of the transistor cells and configured to switch on the at least one transistor cell by providing a gate current in a first direction and configured to switch off the at least one transistor cell by providing a gate current in a second direction, the second direction being opposite to the first direction; and at least one gate-resistor structure monolithically integrated in the transistor device, the gate-resistor structure providing a first resistance for the gate current when the gate current flows in the first direction, and providing a second resistance for the gate current, which is different from the first resistance, when the gate current flows in the second direction.

Further, a gate-resistor structure on a semiconductor body is disclosed. The semiconductor body comprises a gate electrode of a first conductivity type or a second conductivity type and the gate electrode comprises a top surface. The gate structure comprises: a first semiconductor region of the first conductivity type, extending from the top surface into the gate electrode in a vertical direction; a second semiconductor region of the second conductivity type, arranged adjacent to the first semiconductor region, thus forming a p-n junction with the first semiconductor region, the second semiconductor region being arranged below the first semiconductor region in a vertical direction; an insulating layer arranged to insulate the first semiconductor region from the surrounding gate electrode; and a contact layer arranged on the top surface, covering the first semiconductor region to electrically connect the first semiconductor region and additionally covering portions of the top surface beside the first semiconductor region in a horizontal direction.

Further, a gate-resistor structure on a semiconductor body is disclosed. The gate-resistor structure comprises: a first resistance section of a first or a second conductivity type, the first resistance section comprising a top surface; a second resistance section electrically coupled between a connecting layer and a gate contact, the connecting layer being configured to be coupled to a plurality of transistor cells and the gate contact being configured to switch on the plurality of transistor cells by providing a gate current in a first direction and configured to switch off the plurality of transistor cells by providing a gate current in a second direction, the second direction being opposite to the first direction; a first insulating layer arranged to insulate the connecting layer, the first resistance section and the second resistance section from the semiconductor body; a second insulating layer arranged to insulate the first resistance section from the connecting layer and the second resistance section; and a first diode region extending from the top surface of the first resistance section into the first resistance section in a vertical direction, the first diode region and the first resistance section being coupled in series between the connecting layer and the gate contact.

BRIEF DESCRIPTION OF THE DRAWINGS

The invention can be better understood with reference to the following drawings and descriptions. The components in the figures are not necessarily to scale; instead, emphasis is placed upon illustrating the principles of the invention. Moreover, in the figures, like reference numerals designate corresponding parts. In the drawings.

DETAILED DESCRIPTION

In the following detailed description, reference is made to the accompanying drawings, which form a part thereof, and in which is shown by way of illustration specific embodiments in which the invention may be practiced. In this regard, directional terminology, such as "top", "bottom", "front", "back", "horizontal", "vertical", etc., is used with reference to the orientation of the Figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention.

Power MOS transistors, such as metal oxide semiconductor transistors (MOSFETs) or insulated gate bipolar transistors (IGBTs) are voltage-driven devices. They are switched on and off by charging and discharging, respectively, a gate structure formed by a conductive layer in conjunction with an insulating layer. In order to control the transition between a non-conductive and a conductive state of the transistor (and vice versa), a gate-resistor is usually connected to the gate electrode of the transistor. The dynamic performance of the power MOS transistor can be adjusted by the value of this gate-resistor. The gate-resistor influences the switching time, switching losses and several other parameters of the transistor. The value of the gate-resistor may be selected in accordance with the individual application parameters. Individual application parameters may include the transistor technology, switching frequency, losses, and the application layout, for example.

Figure 1:
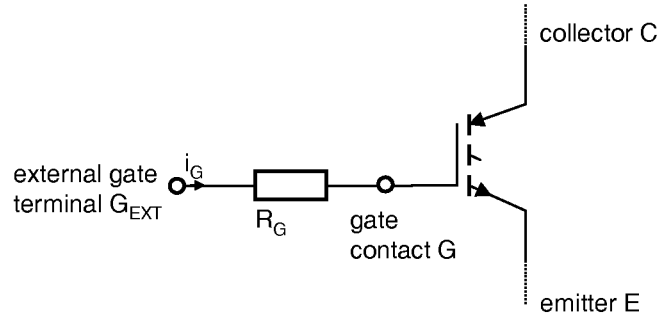
FIG. 1 illustrates an example of an IGBT with an external gate-resistor.

An arrangement of a power MOS transistor and an external gate-resistor is exemplarily shown in FIG. 1. In FIG. 1 an IGBT has a collector contact C, an emitter contact E and a gate contact G. The gate contact G of the IGBT is coupled to an external gate terminal $G_{EXT}$ via a gate-resistor $R_G$. The external gate terminal $G_{EXT}$ may be coupled to a controllable voltage source (not shown), for example a gate driver circuit. By means of a voltage source and the gate-resistor $R_G$ a gate current may be provided that charges or discharges the gate during the switching processes.

The switching behavior of the IGBT, or any other power MOS transistor, is affected by the external gate-resistor $R_G$. The gate-resistor $R_G$ determines the time that is needed for the charging and discharging of the gate, by limiting the magnitude of the gate current pulses during turn-on and turn-off.

A single external gate-resistor $R_G$ is often used for both switch-on and switch-off of power MOS transistors. However, a more advanced gate control may be realized by using different resistors for turn-on and turn-off. In some applications, different gate current values are desired for charging and discharging the gate capacitor of a MOS transistor.

FIG. 2a illustrates an IGBT similar to the one depicted in FIG. 1. The IGBT of FIG. 2a has, however, two gate-resistors $R_{G1}$, $R_{G2}$ coupled in parallel between its gate contact G and the external gate terminal $G_{EXT}$. In order to obtain a different gate-resistor value for switch-on and switch-off of the IGBT, a diode $D_1$ is coupled in series to one of the gate-resistors $R_{G1}$. Depending on whether the diode $D_1$ is connected to the gate contact G of the IGBT with its anode or its cathode, the diode $D_1$ blocks either upon application of a positive or a negative gate voltage or gate $i_G$. In this way it is possible to obtain different effective gate-resistor values for the switch-on and the switch-off of the IGBT. In the present example the effective gate-resistor value corresponds to the resistance of resistor $R_{G2}$ when charging the gate (i.e., $i_G>0$), whereas the effective gate-resistor value corresponds to the resistance of the parallel circuit of the resistors $R_{G1}$ and $R_{G2}$ when discharging the gate (i.e., $i_G<0$).

It is further possible to connect a diode $D_1$, $D_2$ in series to each of the gate-resistors $R_{G1}$, $R_{G2}$, as is shown in FIG. 2b. The diodes $D_1$, $D_2$ are coupled antiparallel to each other, in order to allow a gate current both for positive and negative voltages. This is another way of obtaining different effective gate-resistor values for switch-on and switch-off operations of the IGBT. Such gate-resistor arrangements, as explained above, may not only be used with IGBTs, but with any type of power MOS transistor, such as, for example, MOS field effect transistors.

Figure 2:
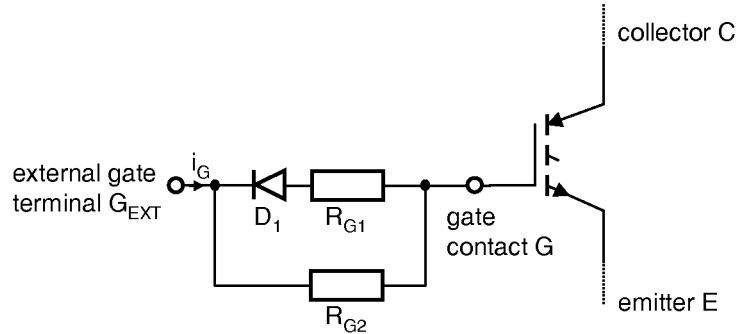
FIG. 2 (which includes FIGS. 2a and 2b) illustrates further examples of an IGBT with an external gate-resistor, FIG. 3 (which includes FIGS. 3a and 3b) illustrates examples of an IGBT having an integrated gate-resistor structure.
Figure 2:
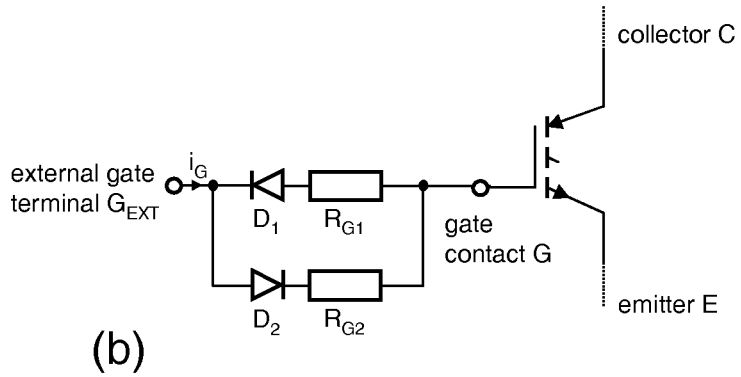

FIGS. 1 and 2 both show external resistor arrangements. Such external resistor arrangements, however, have several disadvantages. For example, they usually require a relatively complicated drive circuit design. Furthermore, various undesired effects may occur due to unavoidable parasitic circuit components present within such gate driver circuits.

The present invention provides a solution that makes external resistor arrangements unnecessary for power MOS transistors by monolithically integrating one or more gate-resistors within the power MOS transistor.

Figure 3:
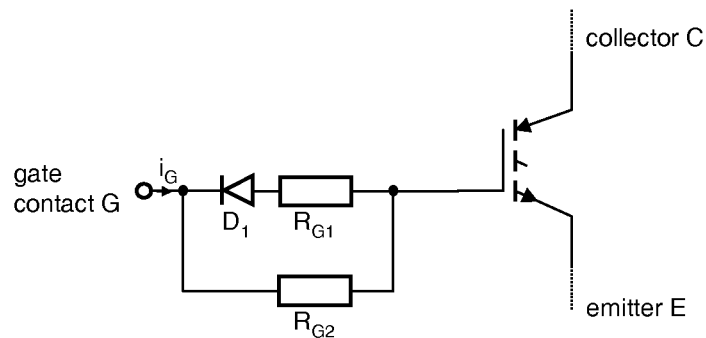
Figure 3:
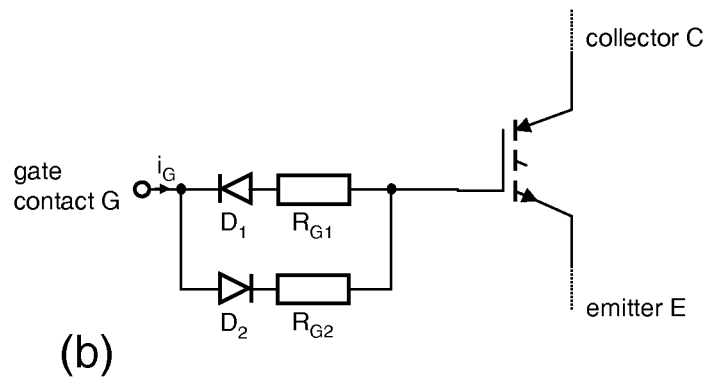

FIG. 3a illustrates an IGBT similar to the one depicted in FIGS. 1 and 2. The IGBT of FIG. 3a, however, has an integrated gate-resistor structure. The gate-resistor structure is arranged between a gate electrode of the IGBT (not illustrated in FIG. 3a) and the gate contact G. The gate-resistor structure shown in FIG. 3a is a resistor structure as has been described by means of FIG. 2a. It may, however, also be a resistor structure as has been described by means of FIG. 2b, as is shown in FIG. 3b, for example. By monolithically integrating such a gate-resistor structure in the IGBT, no external components are needed in order to obtain different effective gate-resistor values for the switch-on and the switch-off of the IGBT.

Figure 4:
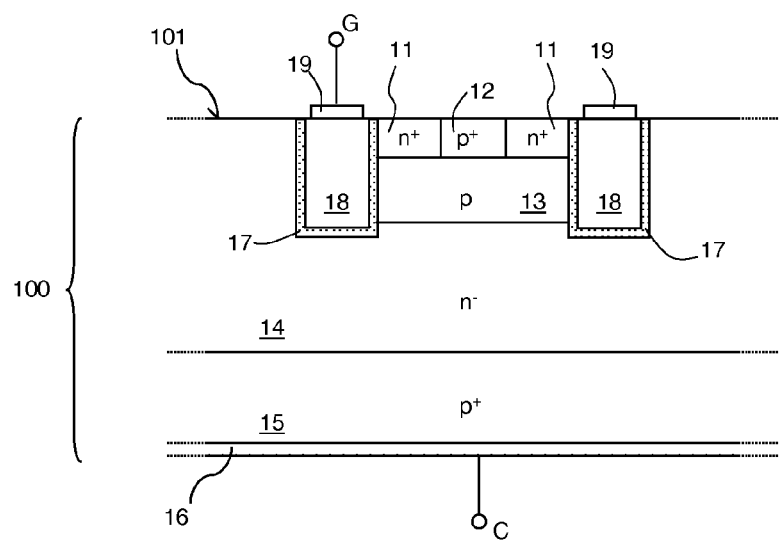
FIG. 4 illustrates a vertical cross section through a vertical transistor component.

FIG. 4 schematically illustrates a vertical cross-section through a vertical trench transistor component, in particular an IGBT, wherein the transistor is composed of a plurality of transistor cells electrically coupled in parallel. Though the following description will relate to a trench MOS structure, the scope of the invention is not limited by the design of the MOS cell and may be easily transferred to other cell concepts (e.g., planar cells). FIG. 4 illustrates one transistor cell. The transistor component includes a semiconductor body 100 with a top surface 101. The semiconductor body 100 may include a conventional semiconductor material, such as silicon (Si), silicon carbide (SiC), gallium arsenide (GaAs), silicon germanium (SiGe), gallium nitride (GaN) or the like. FIG. 4 illustrates a vertical cross-sectional plane of semiconductor body 100. This vertical cross-sectional plane is perpendicular to the top surface 101 of the semiconductor body 100.

Referring to FIG. 4, the semiconductor body 100 includes a collector region 15 of a first conductivity type (e.g., p-type). The collector region 15 is electrically connected to a first electrode 16 (collector electrode) arranged on the bottom surface of the semiconductor body 100. The first electrode 16 forms a collector terminal (a drain terminal, in the case of a MOSFET) C of the transistor component, or is electrically connected to such collector terminal C. The semiconductor body 100 further includes a drift region 14 of a second conductivity type (e.g., n-type) complementary to the first conductivity type. The drift region 14 is coupled to the first electrode 16 via the collector region 15, which is located between the drift region 14 and the first electrode 16. That is, the drift region 14 may adjoin the collector region 15 as shown in FIG. 4. Optionally, a field stop region (not shown) of the second conductivity type and more highly doped than the drift region 14 may be arranged between the drift region 14 and the collector region 15.

The semiconductor body 100 further includes a body region 13 of the first conductivity type (e.g., p-type). The semiconductor body 100 shown in FIG. 3 includes a body contact region 12, which is of the same conductivity type (e.g., p-type) as the body region 13, but usually more heavily doped than the body region 13. The body contact region 12 extends vertically into the semiconductor body 100 from the top surface of the semiconductor body 100 down to the body region 13, so as to allow contacting the body region 13.

The semiconductor body 100 further includes emitter regions 11 of the second conductivity type (n-type). The emitter regions 11 may be highly doped (e.g., $n^+$-type regions). Similar to the body contact region 12, the emitter regions 11 extend vertically into the semiconductor body 100 from the top surface of the semiconductor body 100 down to the body region 13, thereby forming pn-junctions between emitter regions 11 and body region 13. The body region 13 adjoins the drift region 14, thus forming another pn-junction between the body region 13 and the drift region 14. The source regions 11 are spaced apart, in a vertical direction, from the drift region 14 by the body region 13. In a horizontal direction, the body contact region 12 is adjoined by two emitter regions 11. The two emitter regions 11 illustrated in FIG. 4 may be part of one (e.g., square-shaped) emitter region 11 surrounding the body contact region 12. The body contact region 12 may alternatively only be adjoined by one emitter region 11 in one horizontal direction.

The transistor component further includes a gate structure that is at least partly arranged in a trench. The gate structure includes a gate electrode 18 that is arranged in a trench adjacent to an emitter region 11, the body region 13 and the drift region 14, and dielectrically insulated from the surrounding semiconductor body by a first insulating layer 17. The gate electrode 18 may be formed by a polycrystalline silicon layer. The gate electrode 18 extends in a vertical direction from the top surface 101 down to the drift region 14. The gate electrode 18 therefore is capable of controlling a conducting channel in the body region 13 between the emitter region 11 and the drift region 14 in a vertical direction along the first insulating layer 17. The gate electrode 18 is electrically connected to a gate contact layer 19, forming or being electrically connected to a gate contact G. The gate contact layer 19 may be a metallization layer.

Such IGBT structures as illustrated in FIG. 4 are commonly known and thus not further discussed here in great detail. The structure of an IGBT is very similar to that of a power MOSFET. The fundamental difference between the structure of an IGBT and a power MOSFET lies in the collector region 15, which is of a different conductivity type ($p^+$-type in FIG. 3) than the drift region. In this way a further pn-junction is formed between the drift region 14 and the collector region that injects minority carriers into the drift region 14. In the case of a MOSFET, the collector region 15 would be referred to as drain region which has (different from an IGBT) the same doping type as the neighboring drift region. The gate structure, however, may be implemented in the same way for both IGBT and MOSFET devices. Other types of power MOS transistors may also possess such a gate structure.

Figure 5:
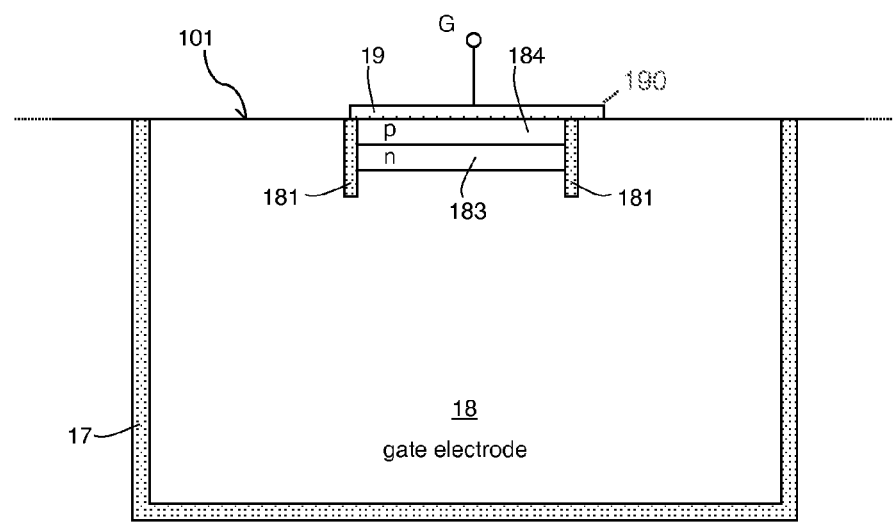
FIG. 5 illustrates a vertical cross section through a gate structure according to one embodiment of the invention.

FIG. 5 illustrates in more detail the contact between the (e.g., polycrystalline silicon) gate electrode 18 and the gate contact G. Referring to FIG. 5, an additional gate-resistor structure is arranged between the gate electrode 18 and the gate contact G. Particularly, the gate-resistor structure is monolithically integrated in the gate electrode 18. The gate-resistor structure includes a p-n junction that may be formed by means of a first semiconductor region 184 (e.g., p-type) and a second semiconductor region 183 (e.g., n-type), which are of different conductivity types. In the exemplary embodiment of FIG. 5, the first semiconductor region 184 is a p-type region and the second semiconductor region 183 is an n-type region. The first semiconductor region 184 extends from the top surface 101 of the semiconductor body 100 vertically into the gate electrode 18. The second semiconductor region 183 is arranged below the first semiconductor region 184 and adjoins the first semiconductor region 184, thus forming a pn-junction, i.e., a diode. The contact layer 19 covers (and thus electrically connects) the first semiconductor region 184. Additionally, the contact layer 19 covers (and electrically connects) parts of the top surface 101 lying next to the first semiconductor region 184. A second insulating layer 181 extends vertically into the gate electrode 18 to isolate the region 184 from the surrounding gate electrode 18. As a result a gate current passes the pn-junction between the regions 184 and 183 when an appropriate gate voltage is applied.

When the transistor component is switched on, a gate current flows from the gate contact G through the contact layer 19 into the gate electrode 18, thus charging the gate. When the transistor component is switched off, a current flows from the gate electrode 18 through the contact layer 19 to the gate contact G, thus discharging the gate (see also FIG. 3).

Now referring to FIG. 5, a gate current may only flow directly between the gate electrode 18 and the contact layer 19 in such regions where the contact layer 19 forms an electric contact to the gate electrode 18. In those portions of the (e.g., metal) contact layer in which the contact layer 19 covers the first semiconductor region 184, the current first has to pass the pn-junction due to the second insulating layer 181. As already mentioned, the second insulating layer 181 insulates the pn-junction from the surrounding gate electrode 18 in a horizontal direction. It may therefore extend from the top surface 101 into the gate electrode 18 in a vertical direction. The insulating layer 181, adjoining the first semiconductor region 184 in a horizontal direction, may extend into the gate electrode 18 to such a depth, as is necessary to insulate the first semiconductor region 184 from the gate electrode 18. However, the insulating layer 181 may also extend further into the gate electrode 18, adjoining the second semiconductor region 183 in a horizontal direction, thereby insulating the second semiconductor region 183 from the gate electrode 18 in a horizontal direction. The insulating layer 181 may even extend deeper into the gate electrode 18 as the p-n junction, as is shown in FIG. 5.

The pn-junction, however, allows a current flow only in one direction and blocks a current flowing in the other direction. Referring to FIG. 5, when switching the transistor component on, the potential difference between the gate contact G and the source region 11 is positive. Therefore, a current can pass from the gate contact G into the gate electrode 18 through the pn-junction formed by the semiconductor regions 184 and 183. When switching off the transistor component, however, the direction of the mentioned potential difference and the respective gate current changes. The pn-junction is reverse biased and thus prevents current flowing from the gate electrode 18 to the contact layer 19. Current may then only flow from the gate electrode 18 to the contact layer 19 via those portion 190 of the gate electrode and the contact layer in which the contact layer 19 adjoins the gate electrode 18 without forming a pn-junction. In essence, the configuration corresponds to the circuit diagram of FIG. 3*a* (except that the pn-junction is flipped).

The resistance for a current flowing to or from the gate contact G depends, inter alia, on the doping concentration and on the geometry of the semiconductor regions 184 and 183 through which the gate current passes. By appropriately choosing the doping concentration or the size and/or geometry of the first and second semiconductor regions 183, 184, as well as the size and/or geometry of such regions 190 in which the contact layer 19 adjoins the gate electrode 18 without forming a pn-junction, a different resistance may be obtained for the currents flowing during switch on and switch off.

Again referring to FIG. 5, the resistance when switching on the component is smaller than the resistance when switching off the component, because during switch-off, the additional current-path provided by the p-n junction (183, 184) is not available and the total gate current has to pass the relatively small surface portion 190. When, instead, the first semiconductor region 184 is an n-type region and the second semiconductor region 183 is a p-type region, the resistance when switching on the transistor would be higher than the resistance when switching off the transistor. This is because the p-n junction would then block a current in the opposite direction.

By monolithically integrating such a structure in the semiconductor device and thereby providing different gate resistances for switch-on and switch-off, external gate resistances or sophisticated gate driver circuits are not needed.

Figure 6:
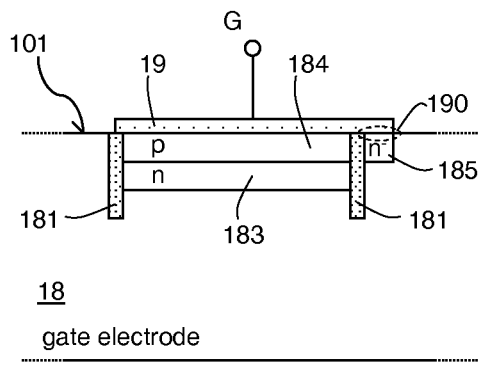
FIG. 6 illustrates a vertical cross section through a gate structure according to a further embodiment of the invention.

Referring to FIG. 6, the gate-resistor structure further includes a third semiconductor region 185. The third semiconductor region 185 extends from the top surface 101 into the gate electrode 18, adjoining the second insulating layer 181 in a horizontal direction. The second insulating layer 181 insulates the third semiconductor region 185 from the first semiconductor region 184. The third semiconductor region 185 is covered by the contact layer 19. The third semiconductor region 185 is of the same conductivity type as the gate electrode 18, but doped less than the gate electrode 18. By inserting such a third, lower doped, semiconductor region 185, the resistance for the gate current passing through this region can be increased. In FIG. 6, current flows through the third semiconductor region 185 during switch off. The resistance during switch-off is therefore increased and is higher than the resistance during switch-on. In essence, the gate resistance effective during the switch-off process of the transistor may be tuned by choosing an appropriate concentration of dopants in the semiconductor region 185. Similarly, the gate resistance effective during the switch-on process of the transistor may be tuned by choosing an appropriate concentration of dopants in the semiconductor regions 183 and 184 forming the pn-junction.

Figure 7:
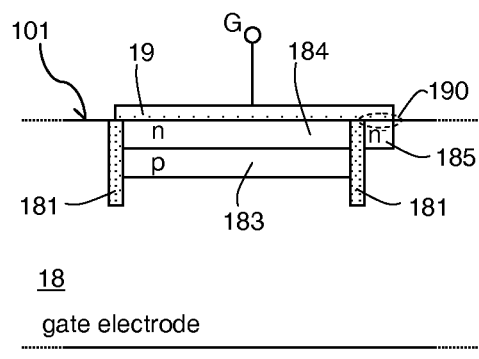
FIG. 7 illustrates a vertical cross section through a gate structure according to a further embodiment of the invention.

Referring to FIG. 7, the conductivity types of the first and second semiconductor regions 184, 183 are interchanged as compared to FIGS. 5 and 6. The first semiconductor region 184 is an n-type region and the second semiconductor region 183 is a p-type region. Therefore, the pn-junction blocks a current in the other direction than in the previous example of FIG. 6. Current may only pass through the pn-junction, when flowing from the gate electrode 18 to the gate contact G (i.e., during switch-off). Therefore, within this embodiment, the resistance during switch-on is higher than the resistance during switch-off.

Now referring to FIGS. 5 to 7, the second semiconductor region 183 may be of the same conductivity type or of a different conductivity type as the gate electrode 18. The second semiconductor region 183 may have the same doping concentration or a different doping concentration than the gate electrode 18. If the second semiconductor region 183 is of a different conductivity type than the gate electrode 18, this results in an unwanted npn-structure or a pnp-structure respectively. The contact between the second semiconductor region 183 and the gate electrode 18 may be implemented as an ohmic contact in such cases.

Figure 8:
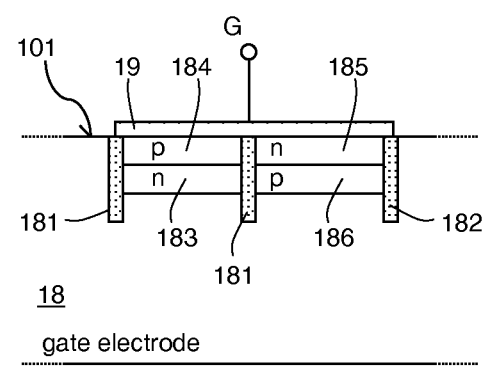
FIG. 8 illustrates a vertical cross section through a gate structure according to a further embodiment of the invention.

Instead of only one p-n junction, the gate-resistor structure may further include a second p-n junction as is shown in FIG. 8. The second p-n junction is formed by the third semiconductor region 185 (see also FIG. 5) and an additional fourth semiconductor region 186. The fourth semiconductor region 186 adjoins the third semiconductor region 185 and is arranged below the third semiconductor region 185 thus forming another pn-junction which is coupled parallel (but oppositely oriented) to the pn-junction formed by the semiconductor regions 183 and 184. The fourth semiconductor region 186 further adjoins the second insulating layer 181. The second insulating layer 181 insulates the second p-n junction from the first p-n junction. A third insulating layer 182 extends from the top surface 101 into the gate electrode 18 in a vertical direction. The third insulating layer 182 adjoins the third semiconductor region 185 and may extend into the gate electrode 18 to such a depth as is necessary to insulate the third semiconductor region 185 from the gate electrode 18. However, the third insulating layer 182 may also extend further into the gate electrode 18, adjoining the fourth semiconductor region 186 in a horizontal direction and insulating the p-n junction from the gate electrode 18. The third insulating layer 182 may also extend further into the gate electrode 18, as is shown in FIG. 8. The example illustrated in FIG. 8 corresponds to the circuit diagram of FIG. 3b. The resistor values may be set by choosing an appropriate concentration of dopants in the semiconductor regions 183, 184, 185, and 186.

The contact layer 19 covers the first semiconductor region 184 and the third semiconductor region 185. The contact layer 19 does not extend to regions of the top surface next to the first or third semiconductor regions 184, 185 in the embodiment shown in FIG. 8. However, it is also possible, that the contact layer 19 extends further, additionally covering portions of the top surface 101 beside the first and third semiconductor zones 184, 185 in a horizontal direction.

Referring to FIG. 8, the first semiconductor region 184 is of a different conductivity type than the third semiconductor region 185. The second semiconductor region 183 is of a different conductivity type than the first semiconductor region 184, in order to form the first pn-junction. The fourth semiconductor region 186 is of a different conductivity type than the third semiconductor region 185, in order to form the second p-n junction. The first pn-junction therefore allows a current flow in a different direction than the second pn-junction. By choosing appropriate doping concentrations and geometries of the different regions, the resistances for switch-on and switch-off may be defined.

Within a gate-resistor structure including two pn-junctions, as described in FIG. 8, it is inevitable that one of the pn-junctions forms an unwanted npn-structure (or pnp-structure) with the gate electrode 18. In such a case, the contact between the respective pn-junction and the gate electrode 18 may be implemented as an ohmic contact.

FIGS. 9 to 12 illustrate several different geometries of a gate-resistor structure. The Figures illustrate horizontal cross sections through the gate structure. They particularly represent a bird's eye view (top view) onto the top surface 101.

Figure 9:
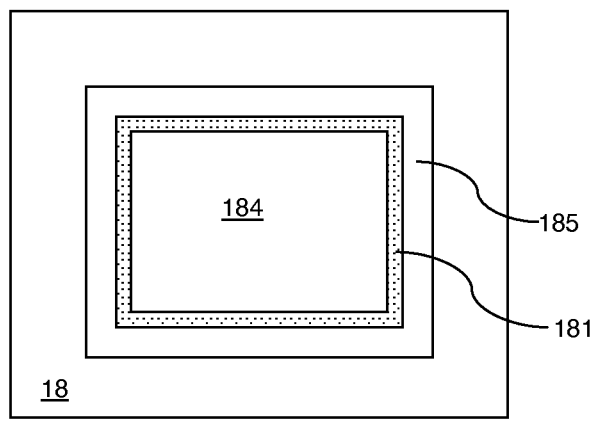
FIG. 9 illustrates a horizontal cross section through a gate structure according to an embodiment of the invention.

Referring to FIG. 9, the first semiconductor region 184 has a rectangular geometry. The first semiconductor region 184 is surrounded by the second insulating layer 181 on all four sides in a horizontal direction, in order to insulate the first semiconductor region 184 from the surrounding regions. The third semiconductor region 185 adjoins the second insulating layer 181 on all four sides in a horizontal direction, surrounding the first semiconductor region 184 and the second insulating layer 181.

The first semiconductor region 184 may, however, also be implemented having other geometries like a quadratic or circular geometry, for example.

Figure 10:
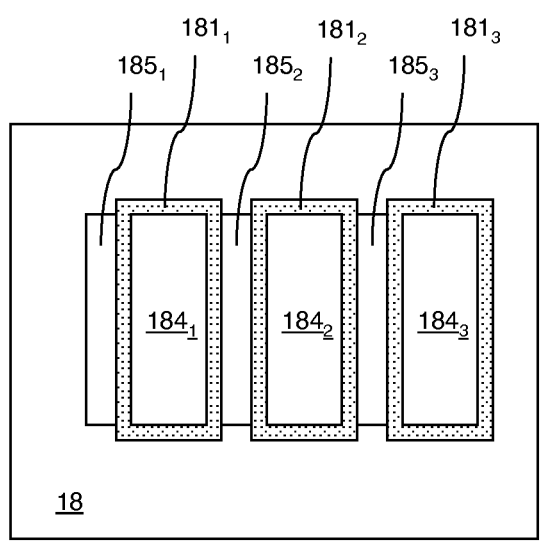
FIG. 10 illustrates a horizontal cross section through a gate structure according to a further embodiment of the invention.

Referring to FIG. 10, the first semiconductor region 184 is divided into three first sub-regions $184_1$, $184_2$, $184_3$. Each first sub region $184_1$, $184_2$, $184_3$ is surrounded by an insulating layer $181_1$, $181_2$, $181_3$ in order to insulate the respective sub layer from the surrounding regions. The third semiconductor region 185 is likewise divided into second sub-regions $185_1$, $185_2$, $185_3$. Those second sub regions $185_1$, $185_2$, $185_3$ are arranged adjacent to the respective insulating layers $181_1$, $181_2$, $181_3$. They do not surround the insulating layers $181_1$, $181_2$, $181_3$. As is shown in FIG. 10, they may be arranged in between two first sub regions $184_1$, $184_2$, $184_3$ and their respective insulating layers $181_1$, $181_2$, $181_3$. They may, as is shown for second sub region $185_1$, for example, also be arranged such that they only adjoin one of the insulating layers $181_1$.

Figure 11:
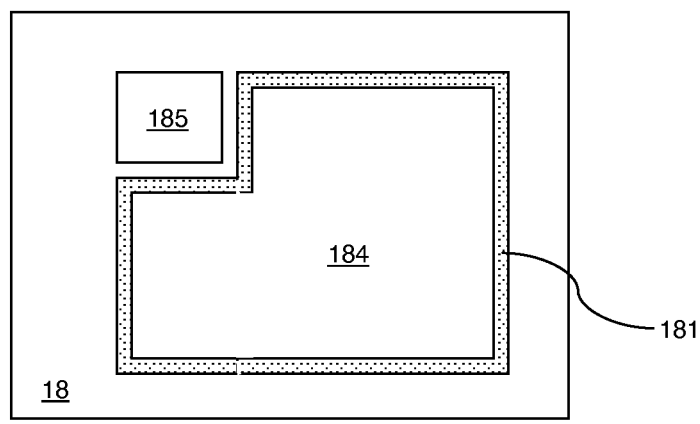
FIG. 11 illustrates a horizontal cross section through a gate structure according to a further embodiment of the invention.

Referring to FIG. 11, the first semiconductor region 184 is designed as a rectangle with one corner missing. The first semiconductor region 184 is surrounded by the second insulating layer 181, which follows the outline of the first semiconductor region 184. The third semiconductor region 185 is arranged in the missing corner of the first semiconductor region 184.

Figure 12:
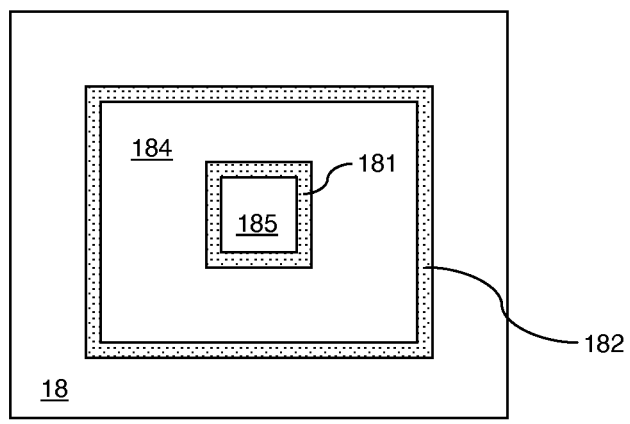
FIG. 12 illustrates a horizontal cross section through a gate structure according to a further embodiment of the invention.

Referring to FIG. 12, the first semiconductor region 184 surrounds the third semiconductor region 185. The second insulating layer 181 insulates the first and the third semiconductor regions 184, 185. A third insulating layer 182 surrounds the first semiconductor region 184, to insulate the first semiconductor region 184 from the surrounding gate electrode 18.

The second semiconductor region 183 and the fourth semiconductor region 186 (if provided) may not be seen in the perspective of FIGS. 9 to 12. They may have the same geometries as the first and third semiconductor regions 184, 185, respectively. They may, however, also have different geometries.

The different geometries shown are only examples. The semiconductor regions of the gate-resistor structure may possess any other geometry and may be arranged in any other way. The semiconductor regions, as well as the insulating layers, may be divided into any number of sub regions or sub layers. The sub regions and sub layers may again possess any geometry. As has been described with respect to FIG. 5, a third (and fourth) semiconductor region is not necessarily needed.

The contact layer 19 (not shown in FIGS. 9 to 12) may be arranged in any suitable way on the top surface 101 to electrically contact the first semiconductor region 184 and additionally covering portions of the top surface beside the first semiconductor region in a horizontal direction. The contact layer 19 may also be divided into any number of sub contact layers which may be arranged on the top surface 101. In one embodiment, a first part of a number of sub contact layers forms or is electrically connected to a first gate contact which is used during switch on. A second part of the number of sub contact layers forms or is electrically connected to a second gate contact used during switch-off.

The gate structure does not need to be implemented in a vertical direction, as described above, but may also be implemented in a lateral direction.

Transistors, such as MOSFETs (Metal Oxide Semiconductor Field Effect Transistors) or IGBTs (Insulated Gate Bipolar Transistors) usually have a plurality of identical transistor cells arranged in a transistor cell field and connected in parallel. An example of such a transistor cell has been explained by means of FIG. 4. Within such transistor cell fields, however, not every transistor cell may include a gate contact layer 19, forming or being electrically connected to a gate contact G. The gate electrodes 18 of the individual transistor cells may instead be connected to each other and to a common gate contact via a connecting layer. This connecting layer may be a polysilicon layer, for example. A common gate pad may be arranged at a position on the connecting layer distant to the gate electrodes 18 of the individual transistor cells. This gate pad may form or may be electrically connected to the common gate contact G.

An external resistor arrangement, as explained by means of FIGS. 1 and 2, may be coupled to this common gate contact G. In this way, a different gate-resistor value for switch-on and switch-off of the transistor cells may be obtained for all transistor cells electrically coupled to the gate pad through the connecting layer.

Figure 13:
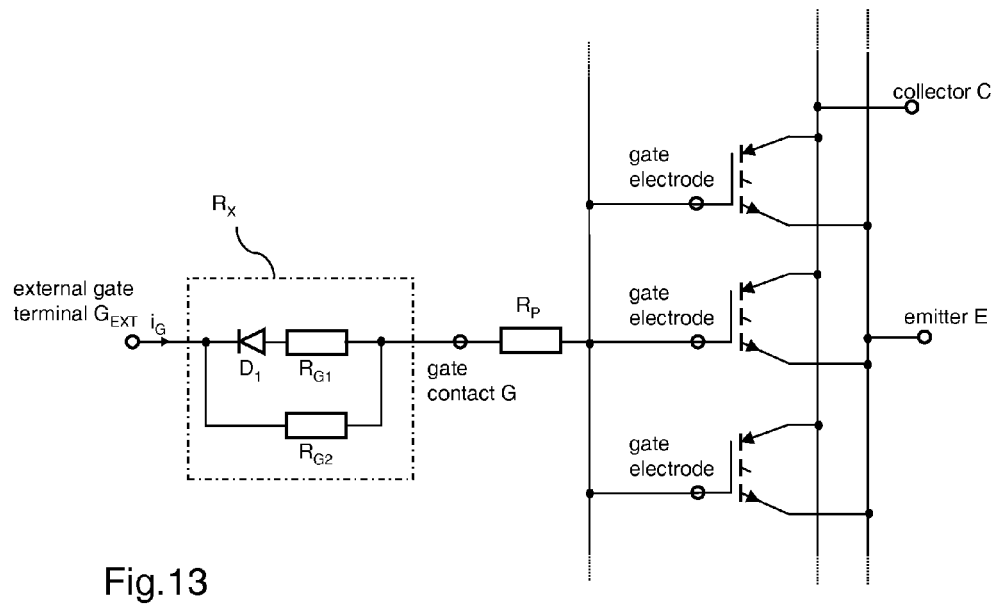
FIG. 13 illustrates an IGBT with several transistor cells having a common external gate-resistor.

An arrangement of a plurality of power MOS transistor cells and an external gate-resistor arrangement is exemplarily shown in FIG. 13. In FIG. 13 each IGBT represents a transistor cell that has a collector electrode, an emitter electrode, and a gate electrode. The collector electrodes of the individual transistor cells are coupled to a common collector contact C. The emitter electrodes of the individual transistor cells are coupled to a common emitter contact E. The gate electrodes of the individual transistor cells are coupled to a common gate contact G. The gate contact G is coupled to an external gate terminal $G_{EXT}$ via a gate-resistor arrangement $R_X$. By means of a voltage source and the gate-resistor arrangement $R_X$, for example, a gate current $i_G$ may be provided to the transistor cells that charges or discharges their gates during the switching processes.

The connecting layer that electrically connects the common gate contact G to the gate electrodes of the individual transistor cells forms a further resistance. In FIG. 13 this resistance of the connecting layer is represented as resistance $R_P$, coupled between the gate contact and the gate electrodes of the individual transistor cells. The exact value of the resistance of the connecting layer may be different for each single transistor cell.

Figure 14:
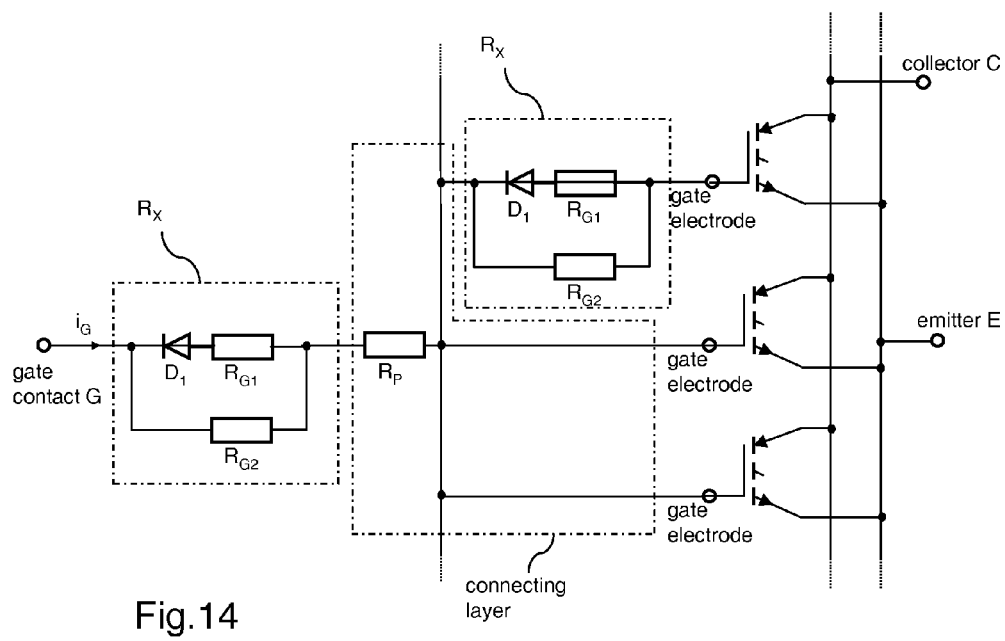
FIG. 14 illustrates an IGBT with several transistor cells having an integrated gate-resistor structure.

FIG. 14 illustrates an arrangement of several transistor cells similar to the one depicted in FIG. 13. The arrangement of FIG. 14, however, has an integrated gate-resistor structure. A gate-resistor structure may be arranged between the gate electrodes of the IGBTs and the connecting layer, for example. In such a case, a gate-resistor structure may be arranged between the connecting layer and the gate electrodes of all transistor cells or between the connecting layer and the gate electrodes of only a part of the transistor cells. A gate-resistor structure may, however, also be additionally or alternatively implemented between the connecting layer and the common gate contact G.

The gate-resistor structures shown in FIG. 14 are resistor structures as have been described by means of FIG. 3a. It may, however, also be a resistor structure as has been described by means of FIG. 3b.

Figure 15:
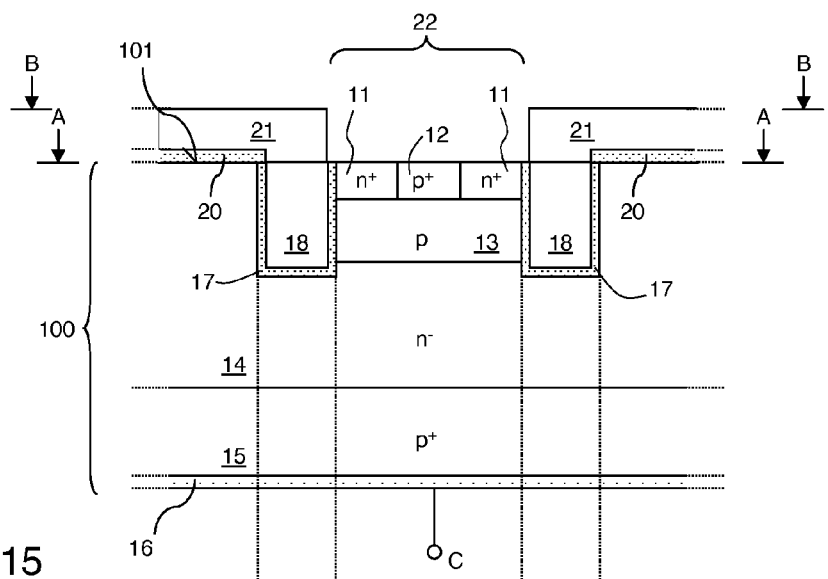
FIG. 15 illustrates a vertical cross section through a transistor cell.

FIG. 15 schematically illustrates a vertical cross section through a vertical trench transistor component, in particular an IGBT, wherein the transistor is composed of a plurality of transistor cells electrically coupled in parallel, having a common gate pad (not shown). FIG. 15 illustrates one of the transistor cells. The general structure of the transistor cell is the same as has been explained above by means of FIG. 4. However, the transistor cell of FIG. 15 does not include a gate contact layer 19, forming or being electrically connected to a gate contact G. The transistor cell instead includes a connecting layer 21. The connecting layer 21 may be formed by a polycrystalline silicon layer. The connecting layer 21 is arranged above the top surface 101 of the semiconductor body 100 in a vertical direction, covering at least parts of the gate electrode 18 and the drift region 14. An insulating layer 20 is arranged such that it insulates the connecting layer 21 from the drift region 14. The connecting layer 21 electrically contacts the gate electrode 18. The emitter regions 11 and the body contact region 12 are usually not covered by the connecting layer 21. The area formed by the emitter and body contact regions 11, 12 will in the following be referred to as source area 22.

Figure 16:
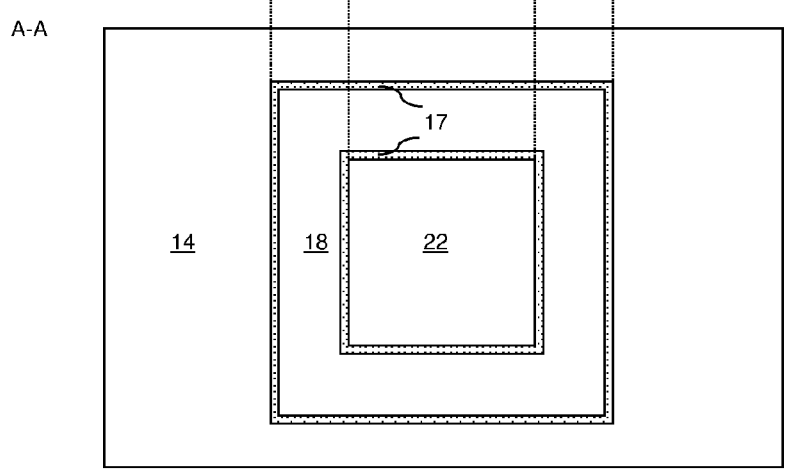
FIG. 16 illustrates a first horizontal cross sectional view of a transistor cell.

FIG. 16 illustrates a first horizontal cross sectional view of the transistor cell according to FIG. 15 in a horizontal section plane A-A. Just for illustration purposes, the transistor cell has a square shape in the embodiment illustrated in FIG. 16. However, this is only an example. The transistor cell could be implemented with shapes other than a square shape as well. The source area 22 is surrounded by the insulating layer 17 in a horizontal direction. The gate electrode 18 further surrounds the source area 22, being electrically insulated from the source area 22 by the insulating layer 17. The insulating layer 17 further electrically insulates the gate electrode 18 from the surrounding drift region 14.

Figure 17:
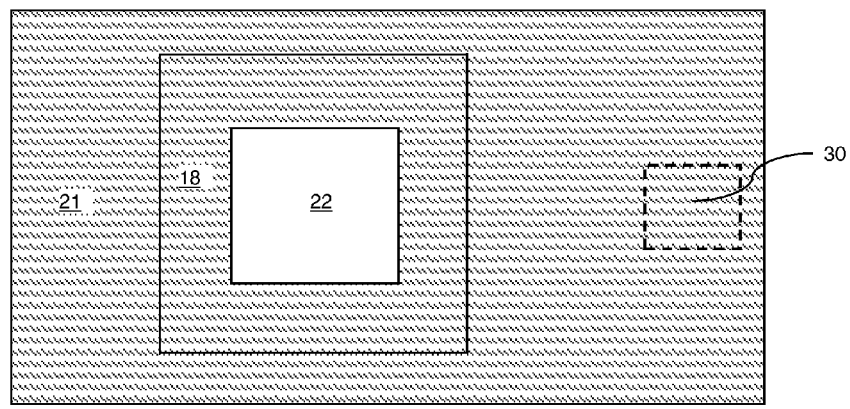
FIG. 17 illustrates a second horizontal cross sectional view of a transistor cell.

FIG. 17 illustrates a second horizontal cross sectional view of the transistor cell according to FIG. 13 in a horizontal section plane B-B. In this plane the connecting layer 21 is illustrated, which covers parts of the transistor cell as well as parts of the drift region 14 surrounding the transistor cell. The connecting layer 21 does not cover the source area 22. The gate electrode 18 of the transistor cell is indicated within FIG. 17 for illustration purposes only. At a position on the connecting layer 21 distant to the transistor cell, a gate pad 30 is indicated with dashed lines. The gate pad 30 may be formed by a gate contact layer 19, forming or being electrically connected to a common gate contact G (both not shown in FIG. 17). In this way, the transistor cell as well as other transistor cells within a transistor cell field (not shown) may be electrically connected via the connecting layer. When electrically connecting the individual transistor cells via the connecting layer 21, a gate-resistor structure as has been explained by means of FIGS. 5 to 12 may be arranged between the connecting layer 21 and the gate contact G. The gate-resistor structure may then be omitted within each individual transistor cell.

Figure 18:
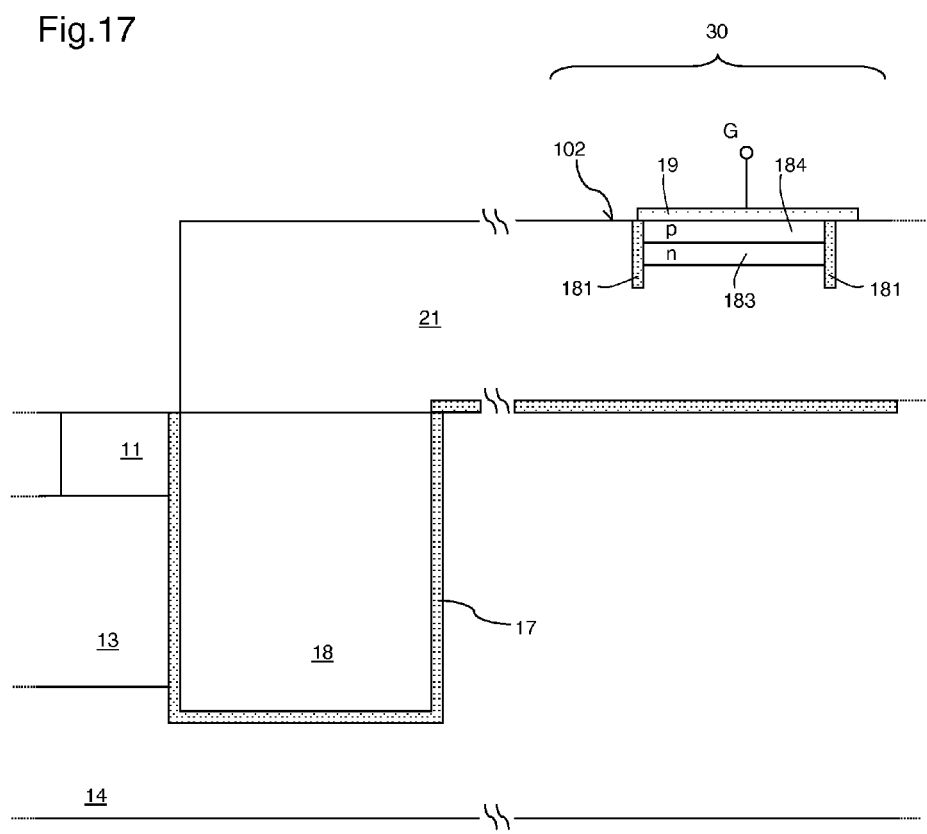
FIG. 18 illustrates a vertical cross section through a transistor cell and an external gate pad with a gate structure according to one embodiment of the invention.

FIG. 18 illustrates a vertical cross section through a transistor cell of a transistor cell field and a common gate pad 30. The transistor cell is not shown in its entirety. The transistor cell may be a transistor cell as has been explained above by means of FIG. 15. The gate pad 30 is arranged distant from the transistor cell. The connecting layer 21 electrically couples the gate pad 30 (and therefore the gate contact G) to the gate electrode 18 of the transistor cell. A gate-resistor structure as has been explained by means of FIG. 5 is arranged between the connecting layer 21 and the common gate contact G. In particular, the gate-resistor structure is monolithically integrated in the connecting layer 21. By monolithically integrating a gate-resistor structure in the connecting layer 21, a different gate-resistor value for switch-on and switch-off may be obtained for all transistor cells electrically coupled to the gate contact G via the connecting layer 21. When integrating the gate-resistor structure in the connecting layer, the gate-resistor structure may be omitted within all or some individual transistor cells. The connecting layer 21 may be a polycrystalline silicon layer of the same conductivity type as the gate electrode 18 of the transistor cell. The connecting layer 21 may have the same doping concentration or a different doping concentration than the gate electrode 18.

The gate-resistor structure may be implemented as has been explained by means of FIGS. 5 to 12, providing different resistances during switch-on and switch-off of the transistor cells. Instead of being implemented in a vertical direction, extending into the connecting layer 21 from a top surface 102 of the connecting layer 21, however, the gate-resistor structure may also be implemented in a lateral direction.

Figure 19:
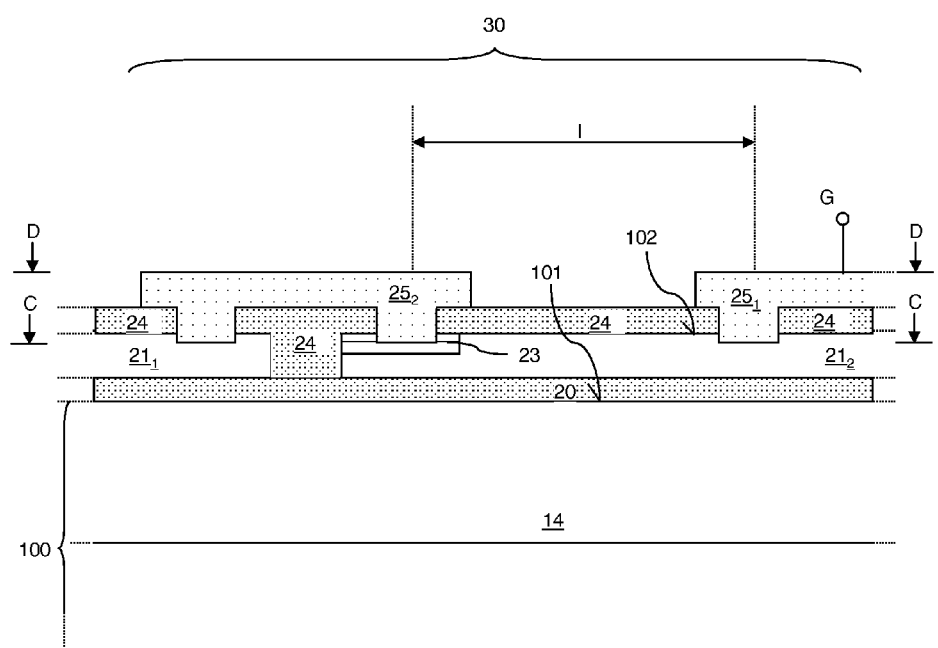
FIG. 19 illustrates a vertical cross section through a gate pad with a lateral gate-resistor structure according to a further embodiment of the present invention.
Figure 20:
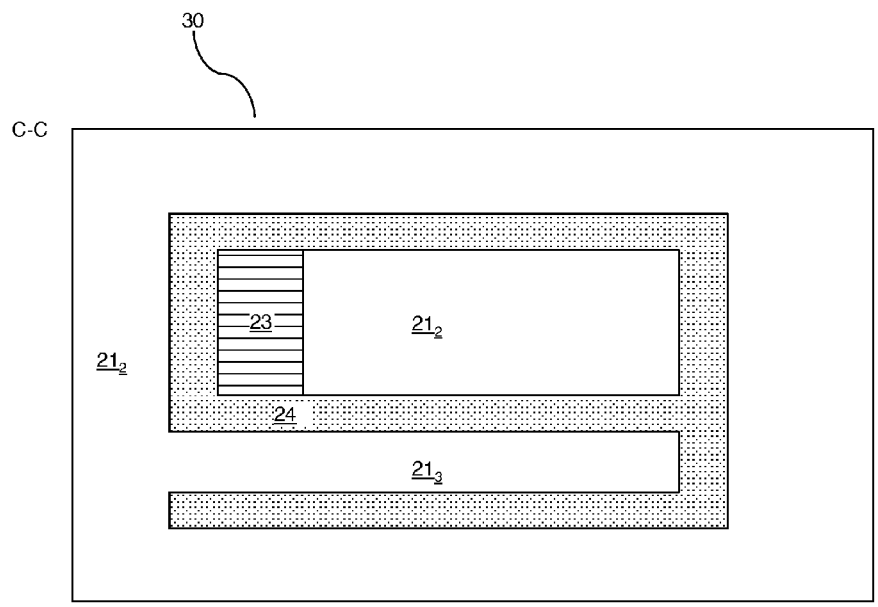
FIG. 20 illustrates a horizontal cross section in a first section plane through a lateral gate-resistor structure according to the embodiment of FIG. 19.
Figure 21:
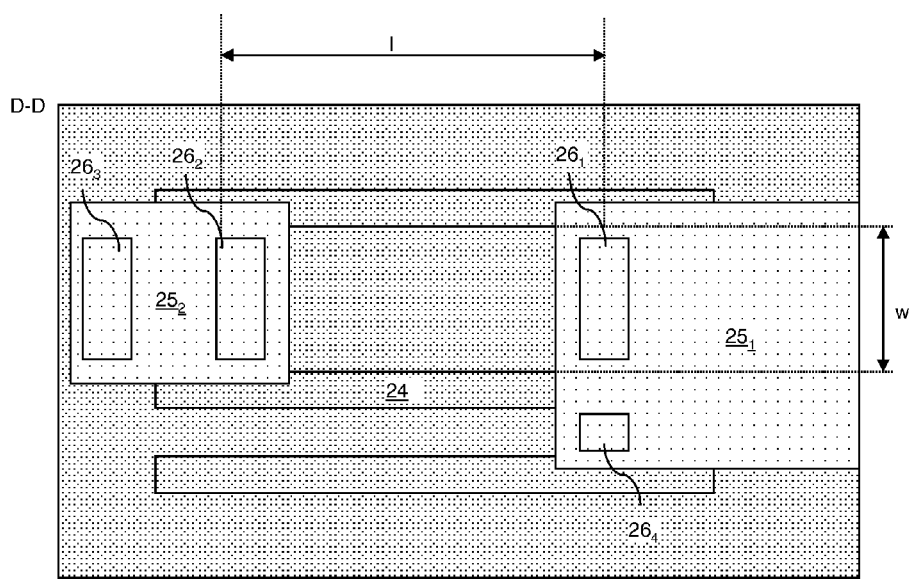
FIG. 21 illustrates a horizontal cross section in a second section plane through a lateral gate-resistor structure according to the embodiment of FIG. 19.

A lateral gate-resistor structure is illustrated in FIGS. 19 to 21. The connecting layer 21 has a certain resistance value. This resistance value is the same for switch-on and switch-off of the transistor cells, as the gate current flows through the same current paths during switch-on and switch-off. In FIG. 19 a common gate-resistor structure is illustrated. The connecting layer 21 is arranged above the drift region 14 of the semiconductor body 100. The connecting layer 21 is electrically insulated from the drift region 14 by an insulating layer 20. The connecting layer 21 has a top surface 102. The connecting layer 21 includes a connecting section $21_1$ and a first resistance section $21_2$. The connecting section extends on the first surface 101 of the semiconductor body 100 to electrically contact the transistor cells (not shown). The first resistance section $21_2$ is electrically insulated from the connecting section $21_1$ by an insulating layer 24. The insulating layer 24 is arranged between the first resistance section $21_2$ and the connecting section $21_1$ in a horizontal direction. The insulating layer 24 is further arranged above parts of the top surface 102 of the connecting layer 21. This is to electrically insulate the connecting layer 21 from metal layers $25_1$, $25_2$ arranged above the connecting layer 21.

A first metal layer $25_1$ is arranged on the top surface 102 of the connecting layer 21. The first metal layer $25_1$ covers parts of the first resistance section $21_2$. Through an opening in the insulating layer 24 the first metal layer $25_1$ extends vertically into the first resistance section $21_2$ to electrically contact the first resistance section $21_2$. The first metal layer $25_1$ may be a gate contact layer, for example, forming or being electrically connected to a common gate contact G.

A diode region 23 extends vertically into the first resistance section $21_2$ from the top surface 102 of the connecting layer 21. The diode region 23 is of a different conductivity type than the first resistance section $21_2$. The diode region 23 and the first resistance section $21_2$ therefore form a pn-junction. This is, however, only an example. The diode region 23 may instead be a metal layer, for example, such that the diode region 23 and the first resistance section $21_2$ form a Schottky diode.

A second metal layer $25_2$ is arranged above the connecting layer 21. The second metal layer $25_2$ covers parts of the first resistance section $21_2$ as well as parts of the connecting section $21_1$. The second metal layer $25_2$ extends vertically through a first opening in the insulating layer 24 in order to electrically contact the connecting section $21_1$. The second metal layer $25_2$ further extends vertically through a second opening in the insulating layer 24 in order to electrically contact the diode region 23. The second metal layer $25_2$ thereby electrically couples the connecting section $21_1$ via the diode region 23 to the first resistance section $21_2$. A gate current provided by the common gate terminal G may then flow via the pn-junction formed by the diode region 23 and the first resistance section $21_2$. The pn-junction, however, allows a current only in one direction and will block a current in the other direction.

FIG. 20 illustrates a vertical cross section through the gate-resistor structure of FIG. 19 in a section plane C-C. As can be seen in FIG. 20, the connecting layer 21 further includes a second resistance section $21_3$. The second resistance section $21_3$ adjoins the connecting section $21_1$ and extends from the connection section $21_1$ in a horizontal direction. The second resistance section $21_3$ may be of the same conductivity type as the connecting section $21_1$ and may have the same doping concentration as the connecting section $21_1$. The first resistance section $21_2$ and the second resistance section $21_3$ each have a rectangular shape in the embodiment illustrated in FIG. 20. However, this is only an example. The first resistance section $21_2$ and the second resistance section $21_3$ are further arranged parallel to each other in a horizontal direction in the embodiment illustrated in FIG. 20. This is also only an example. The first resistance section $21_2$ and the second resistance section $21_3$ may have any other shape and may be arranged in any other way.

The diode region 23 is arranged at one end of the first resistance section $21_2$. In particular, the diode region 23 may be arranged at an end of the first resistance section $21_2$ that is closest to the connection section $21_1$. This is, however, only an example. The diode region 23 may be arranged at any other position within the first resistance section $21_2$.

FIG. 21 illustrates a vertical cross section through the gate pad 30 structure of FIG. 19 in a section plane D-D. The insulating layer 24 is arranged above the connecting layer 21 in a vertical direction. The first and second resistance sections $21_2$, $21_3$ are indicated below the insulating layer 24 for illustration purposes only. The first metal layer $25_1$ is arranged such that it electrically connects the first and the second resistance section $21_2$, $21_3$. The opening $26_1$ in the insulating layer 24, through which the first metal layer $25_1$ extends in a vertical direction into the first resistance section $21_2$ is illustrated for illustration purposes. To electrically contact the second resistance section $21_3$, the first metal layer $25_1$ may extend vertically through a further opening $26_4$ in the insulating layer 24 into the second resistance section $21_3$. This opening $26_4$ is also indicated for illustration purposes.

The second metal layer as explained above covers parts of the first resistance section $21_2$ as well as parts of the connecting section $21_1$. The second metal layer $25_2$ extends vertically through an opening $26_3$ in the insulating layer 24 in order to electrically contact the connecting section $21_1$. The second metal layer $25_2$ further extends vertically through an opening $26_2$ in the insulating layer 24 in order to electrically contact the first resistance section $21_2$. These openings $26_2$, $26_3$ in the insulating layer 24 are also indicated in FIG. 21 for illustration purposes. The diode region 23 in this example is completely covered by the second metal layer $25_2$. This is however only an example. The diode region 23 may also only be partly covered by the second metal layer $25_2$.

When a gate current between the first metal layer $25_1$ (and therefore the common gate contact G) and the transistor cells (not shown) coupled to the connecting section $21_1$ flows in a first direction, in which the pn-junction within the first resistance section $21_2$ blocks the current, the current may only flow through the second resistance section $21_3$. When a gate current flows in an opposite direction, in which the pn-junction allows a current flow, the current flows through both the first and the second resistance section $21_2$, $21_3$. The first and the second resistance section $21_2$, $21_3$ each have a certain resistance value. As the gate current in one direction only flows through one of the resistance sections $21_3$, the resulting gate resistance has a first value depending on the geometry of this resistance section $21_3$. As the current in the opposite direction flows through both resistance sections $21_2$, $21_3$ coupled in parallel, the resulting gate resistance then has a second value different to the first value, which depends on the geometries of the resistance sections $21_2$, $21_3$.

For example, the gate resistance value of the first resistance section $21_2$ depends on the distance l the gate current needs to pass through the first resistance section $21_2$ between the openings $26_1$, $26_2$. The longer this distance l, the higher the gate resistance value. The gate resistance value further depends on a width w of the first resistance section $21_2$. A desired gate resistance value may be obtained by suitably setting the distance l and the width w. The geometry of the first resistance section $21_2$ as illustrated in FIGS. 20 and 21 is only an example. The first resistance section $21_2$ may have any geometry suitable for adequately setting the gate resistance value.

A desired gate resistance value of the second resistance section $21_3$ may be obtained also by suitably choosing the geometry of the second resistance section $21_3$. The gate resistance value of the second resistance section $21_3$ also depends on a length and on a width of the second resistance section $21_3$.

Figure 22:
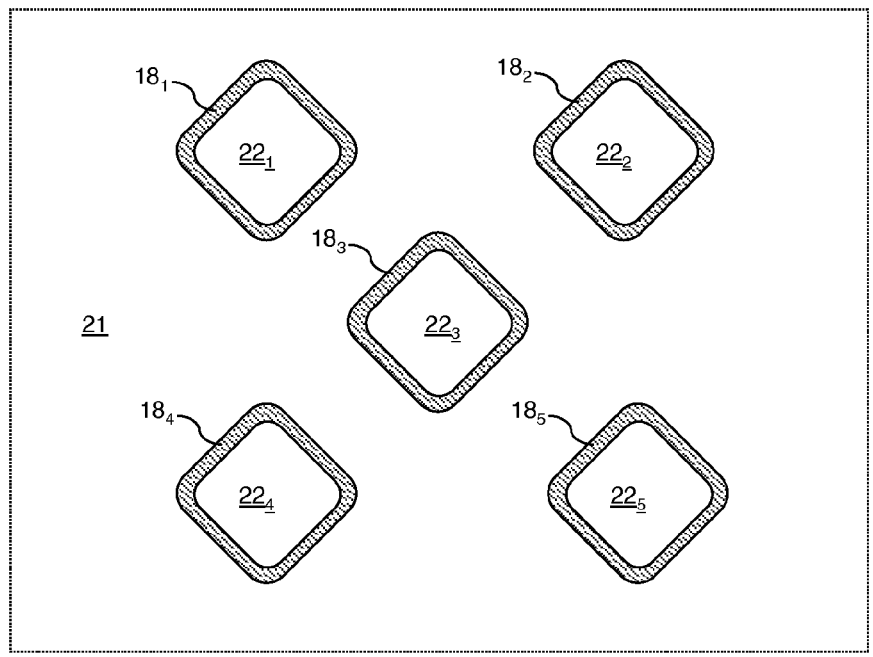
FIG. 22 illustrates a plurality of adjacent transistor cells in a transistor cell field.

In FIG. 22 transistor cells of a transistor cell field are schematically illustrated. As explained above, the connecting layer 21 usually covers most parts of the individual transistor cells. Each transistor cell may be implemented as explained before, e.g., by means of FIG. 15. In FIG. 22 only the source areas $22_1$, $22_2$, $22_3$, $22_4$, $22_5$ and gate electrodes $18_1$, $18_2$, $18_3$, $18_4$, $18_5$ of the individual transistor cells are indicated. The gate electrodes $18_1$, $18_2$, $18_3$, $18_4$, $18_5$ are at least partially covered by the connecting layer 21.

Figure 23:
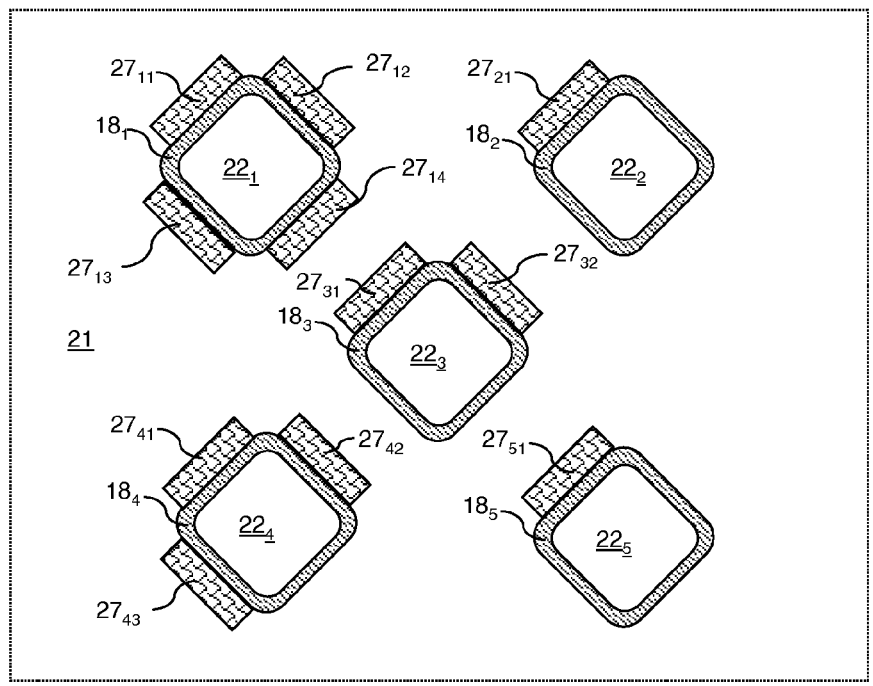
FIG. 23 illustrates a plurality of adjacent transistor cells in a transistor cell field, the transistor cells having poly openings.

In FIG. 23 a further embodiment of the present invention is illustrated. Within this embodiment, different gate resistance values for the individual transistor cells may be obtained. The gate resistance value of each individual cell is dependent on the cross-sectional area that is available for the gate current to flow between the connecting layer 21 and the gate electrode 18. Within the embodiment illustrated in FIG. 23, the connecting layer 21 includes openings 27 arranged adjacent to the transistor cells. By inserting openings 27 in the connecting layer 21, close to the gate electrodes $18_1$, $18_2$, $18_3$, $18_4$, $18_5$ of the individual transistor cells, the cross-sectional area through which the gate current may pass is decreased. The openings 27 will be referred to as poly openings in the following. By inserting only one poly opening close to a transistor cell, e.g., poly opening $27_{21}$ or $27_{51}$, the cross-sectional area for each of those transistor cells is decreased by a first amount and the gate resistance value thereby increases a certain amount. By inserting more poly openings close to one transistor cell, the gate resistance value may be increased even more. This is, however, only an example. The gate resistance value not only depends on the number of poly openings, but also on the size of each poly opening.

Just for illustration purposes, the transistor cells have a square shape in the embodiment illustrated in FIG. 23. However, this is only an example. The individual transistor cells could be implemented with shapes other than a square shape as well. Further, the geometry of the poly openings 27 is only an example. The poly openings 27 may also be implemented with shapes other than a rectangular shape.

Figure 24:
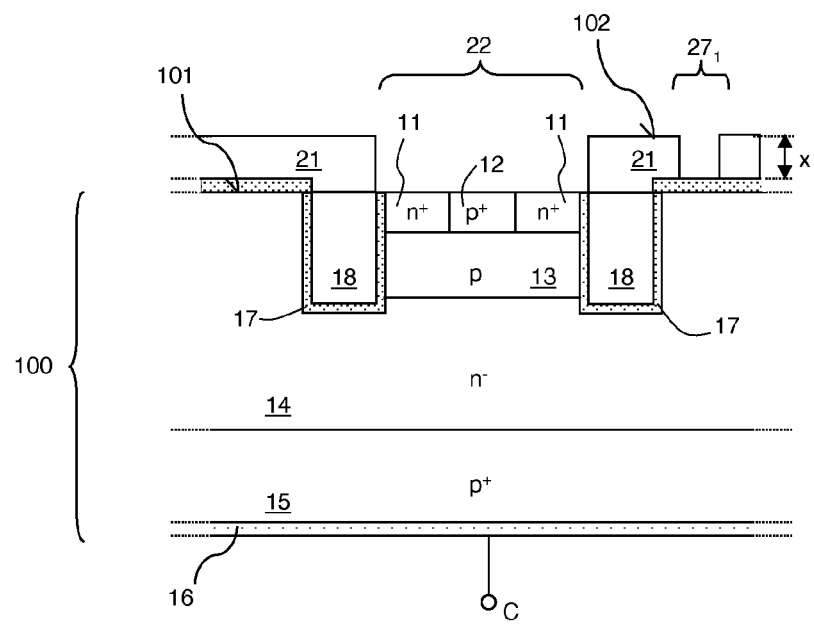
FIG. 24 illustrates a vertical cross section through a transistor cell having a poly opening.

FIG. 24 illustrates a vertical cross section through a transistor cell having a poly opening $27_1$. The poly opening $27_1$ may extend from the top surface 102 of the connecting layer 21 into the connecting layer 21 in a vertical direction. If the depth of a poly opening $27_1$ in a vertical direction corresponds to a thickness x of the connecting layer 21, no current may pass from the connecting layer 21 to the gate electrode 18 in this region. The current may then only pass into the gate electrode 18 in regions where the connecting layer 21 does not have any poly openings $27_1$. If the depth of a poly opening $27_1$ is less than the thickness x of the connecting layer 21, the gate resistance value is also increased, as the cross-sectional area that is available for the gate current to flow to or from the gate electrode 18 is also decreased.

Figure 25:
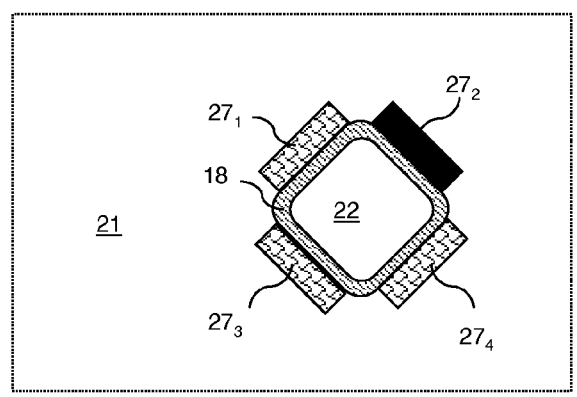
FIG. 25 illustrates a transistor cell in a transistor cell field, the transistor cell having poly openings and a Schottky region.

FIG. 25 further illustrates a transistor cell having a source area 22, a gate electrode 18 and poly openings $27_1$, $27_2$, $27_3$, $27_4$. The poly openings $27_1$, $27_3$ and $27_4$ are implemented as has been explained by means of FIGS. 23 and 24. Poly opening $27_2$, however, is implemented as a Schottky region. The Schottky region is a poly opening 27, filled with a metal layer. In this way a Schottky diode is formed. A different gate-resistor value may thereby be obtained for switch-on and switch-off for each individual transistor cell. Such poly openings 27 and Schottky regions may be implemented in addition to a gate-resistor structure arranged between the connecting layer 21 and the common gate contact G, for example.

Spatially relative terms such as "under", "below", "lower", "over", "upper", "horizontal", "vertical" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although present embodiments and its advantages have been described in detail, it should be understood that various changes, substitutions and alterations can be made herein without departing from the spirit and the scope of the invention as defined by the appended claims. With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A gate-resistor structure on a semiconductor body, the gate-resistor structure comprising:
    a connecting layer being disposed outside of the semiconductor body and comprising a connecting section, the connecting section being coupled to a plurality of transistor cells;
    a first resistance section of the connecting layer, the first resistance section of a first or a second conductivity type;
    a gate contact for receiving a gate signal for the transistor cells, the gate contact being coupled to the first resistance section;
    a second resistance section of the connecting layer, the second resistance section electrically coupled to the gate contact;
    an insulating layer insulating the first resistance section from the connecting section and the second resistance section; and
    a first diode region arranged in the first resistance section to form a diode, wherein the first resistance section including the diode is coupled between a portion of the first resistance section directly adjoining the first diode region and the gate contact.

2. The gate-resistor of claim 1, wherein the first diode region extends from a top surface of the first resistance section into the first resistance section in a vertical direction.

3. The gate-resistor of claim 1, further comprising:
    a further insulating layer arranged to insulate portions of the connecting layer that include the connecting section, the first resistance section and the second resistance section from the semiconductor body.

4. The gate-resistor of claim 3, wherein the further insulating layer completely separates the connecting layer from the semiconductor body.

5. The gate-resistor structure of claim 1, further comprising a first contact layer arranged to electrically connect the first resistance section to the second resistance section.

6. The gate-resistor structure of claim 1, further comprising a second contact layer arranged to electrically connect the first diode region to the connecting section.

7. The gate-resistor of claim 1, wherein the connecting layer is a layer of polysilicon.

* * * * *